(12) United States Patent
Guthrie et al.

(10) Patent No.: US 6,492,247 B1
(45) Date of Patent: Dec. 10, 2002

(54) METHOD FOR ELIMINATING CRACK DAMAGE INDUCED BY DELAMINATING GATE CONDUCTOR INTERFACES IN INTEGRATED CIRCUITS

(75) Inventors: William H. Guthrie, Essex Junction, VT (US); Andreas Kluwe, Essex Junction, VT (US); Michael Ruprecht, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 8 days.

(21) Appl. No.: 09/717,970

(22) Filed: Nov. 21, 2000

(51) Int. Cl.⁷ .............................................. H01L 21/46
(52) U.S. Cl. ...................... 438/460; 438/658; 438/719; 438/680; 501/87; 257/639
(58) Field of Search ................. 438/460, 462, 438/669, 584, 515, 526, 113, 114, 658, 719, 769, 954, 680; 257/639; 501/87

(56) References Cited

U.S. PATENT DOCUMENTS

| | | | |
|---|---|---|---|
| 5,096,855 A | 3/1992 | Vokoun, III | |
| 5,530,280 A | 6/1996 | White | |
| 5,650,348 A | 7/1997 | Pasch | |
| 5,665,655 A | 9/1997 | White | |
| 5,789,302 A | 8/1998 | Mitwalsky et al. | |
| 6,100,589 A | * 8/2000 | Tanaka | 257/758 |
| 6,365,958 B1 | * 4/2002 | Ibnabdeljalil et al. | 257/620 |
| 6,372,661 B1 | * 4/2002 | Lin et al. | 438/769 |

\* cited by examiner

*Primary Examiner*—Matthew Smith
*Assistant Examiner*—Renzo N. Rocchegiani

(57) ABSTRACT

A method for manufacturing integrated circuits ("IC") on wafers to manage crack damage in the ICs such that crack propagation into the IC active array is reduced or eliminated. The method provides for a defined separation or divide of the IC gate conductor from the IC crack stop or IC edge. The method is especially useful in managing crack damage induced through the delamination of one or more of the gate conductor surface interfaces as a result of the IC wafer dicing process. Circuits or chips manufactured according to the methods disclosed are also taught.

15 Claims, 4 Drawing Sheets

METHOD FOR ELIMINATING CRACK DAMAGE INDUCED BY DELAMINATING GATE CONDUCTOR INTERFACES IN INTEGRATED CIRCUITS

TECHNICAL FIELD

This invention generally relates to methods of manufacturing integrated circuits ("IC"), memory circuits or memory chips. More particularly, this invention relates to a method for manufacturing ICs to manage crack damage and propagation especially where the crack damage is induced by the delamination of the gate conductor surface interfaces during the IC wafer dicing process.

BACKGROUND OF THE INVENTION

The full-scale production of ICs or other types of chips that are fabricated on wafers involves the forming of many individual ICs on the wafer and then separating the ICs by a dicing or cutting process. The fabrication of ICs may be completed through different methods and steps, but generally involves depositing layers of conducting, semiconducting and insulating materials in precise patterns on a substrate or wafer to form the desired circuit or array patterns. The dicing process is required to separate the individual ICs from the wafer.

It is during this dicing step that delamination, scalloping or cracking of some of the layers deposited on the wafer may occur as a result of the vibration and impact forces imparted to the wafer. Even if cracks are not directly produced in the wafer by the dicing process, the delamination or scalloping of the wafer layers may later lead to the development of cracks in the, or in between the, wafer layers. In particular, cracks may be produced in the wafer substrate or the conductive layer deposited in the dicing channel formed between the individual ICs.

If cracks develop in the IC during the dicing process, or propagate into the IC after the dicing process, the functional performance of the chip may be affected. More particularly, if a crack formed in the wafer or conductive layer propagates into the active array or circuit, functional performance will likely be adversely affected. For example, if a crack propagates into the IC, the active array or the circuit, fatigue failures or separation failures of the IC layers may result. Separation failures may in fact include a layer or layers of the IC breaking off. Obviously, such failures may compromise the electrical performance of the chip and are unacceptable.

While propagation of a crack within the IC during the dicing process is an issue, crack propagation after the completion of the dicing process can also occur as a result of testing of the IC. For example, thermal cycling tests, which are standard reliability tests conducted on ICs, may induce crack propagation. Similarly, crack propagation can occur as a result of packaging of the ICs. These later failures are problematic because while the chip may appear functional after initial separation from the wafer, it may later fail due to propagation of the crack into the chip active circuit.

Several mechanisms to stop or control the propagation of cracks within ICs are available and used in the manufacturing of ICs. The traditional method to control cracks is through the use of crack stops in the form of air gaps or filled gaps specifically designed into the IC layered structure. Air gaps are simply the creation of perimeter voids or air channels in the IC, which serve as natural termination points for edge cracks propagating within the solid dielectric material or between the metal wiring and the dielectric material. Air gaps, if deep enough, can prevent the horizontal propagation of any edge crack in the IC device, including cracks arising from delamination of the gate dielectric. However, typical dry etch process integration requires or may require the air gap to be terminated on top of the gate conductor. The resulting air gap is then ineffective in stopping cracks caused by delamination in the upper films of the gate conductor.

Filled gaps are perimeter walls of metal wiring material, which also serve as blocking or termination points for edge cracks. In order to make a metal-filled gap, the IC wiring on both the active and kerf side must, by design, not extend up to the gap. The resulting metal wall may then be effective in stopping edge cracks which propagate in the intervening dielectric materials. However, if the metal-filled gap is built on top of the gate conductor, as typical IC processing requires, it will be ineffective in stopping horizontal cracks which develop within the gate conductor, for example by delamination of the surface films. Moreover, it has been found that even if the gate conductor is pulled back by design, if it is not pulled back far enough, a crack propagating from the end of the gate conductor may still pull apart the metal, enter the active array of the chip, and cause failure. This is particularly the case when the metal wall is comprised of dissimilar metal wiring elements stacked on top of each other, such as aluminum and tungsten.

Two examples of processes and designs for controlling cracks in ICs are U.S. Pat. Nos. 5,530,280 and 5,665,655, both disclosing a Process For Producing Crackstops On Semiconductor Devices And Devices Containing The Crackstops, both being issued to White and assigned to the Applicant. Both White patents disclose processes for producing metal-filled gaps and, by subsequent etch removal of the metal, air gaps. FIG. 20 in the '655 White patent shows a typical metal-filled crackstop, which is built on top of the silicon substrate. The active device area typically contains a gate conductor, but there is no teaching about whether that gate conductor may extend under the crackstop, if the gate conductor must be removed from below the crackstop prior to building the crackstop, or if removed, how far away it must be from the crackstop. Indeed, because the entire scope of the two White patents is how to form metal-filled crackstops, the gate conductor layer is not even shown in any of the White patents figures. FIG. 24 shown in the '655 White patent shows an air gap or air channel crackstop produced by etch removal of the previously described metal wall. As noted, there is no teaching in the '655 White patent about the gate conductor layer on the substrate.

Similarly, FIG. 25 in the '655 White patent shows an air gap plus metal wall embodiment which would be effective in stopping horizontal cracks in the gate conductor if the gate conductor layer were present on the substrate in the kerf area. However this example, and indeed all air gap examples of the two White patents, are impractical because they require a complex sequence of etch steps to remove the different metals, including typically aluminum and tungsten, which comprise the outer or kerf-side metal wall, and which becomes an air gap. It is further impractical because, as more and more wiring levels are added to IC technologies, it becomes less and less feasible to etch out a high aspect ratio metal wall.

Another method for controlling crack propagation in ICs is disclosed in U.S. Pat. No. 5,789,302, entitled Crack Stops, issued to Mitwalsky et al., and also assigned to the Applicant. The Mitwalsky et al. invention teaches a method of forming crack stops in ICs for substantially preventing cracks produced along the dicing channel from spreading into the IC active area. The crack stops described are formed by creating discontinuities in the thickness of the dielectric layer in the dicing channel near the IC edges. According to Mitwalsky et al., the discontinuities can be formed by increasing and/or decreasing the thickness of the dielectric layer.

While Mitwalsky et al. do disclose a method of controlling crack propagation originating from within the dicing channel, the method does not appear to specifically address the problem of cracks that develop from delamination of wafer layers within the dicing channel. More significant, while Mitwalsky et al. disclose the use of discontinuities formed in the dicing channel near the edge of the IC active array, there is no teaching about the dimensions or geometry of the discontinuity, especially as related to the IC height. It has been discovered, for example that the formation of a discontinuity very close to the edge of the IC active array may not prevent the propagation of a crack from entering the active array. Moreover, the Mitwalsky et al. disclosures appear to be limited to forming discontinuities in the dielectric layer as a means of controlling cracks. If the crack does not form in or extend into the dielectric layer, for example if the crack begins as a delamination of an interface of the gate conductor, then the Mitwalsky et al. invention may have no effect on controlling propagation of the crack.

Accordingly, there remains a need for a method of fabricating ICs to manage crack damage in the IC wafer and to prevent propagation of cracks into the IC active array. The method of fabricating ICs should prevent crack propagation and damage especially where the crack damage is induced by the delamination of the IC gate conductor surface interfaces during the IC wafer dicing process. Moreover, the method should provide dimensional and geometry ground rules for defining preferred separations or divides of the IC gate conductor layer from the IC crack stop or IC edge.

SUMMARY OF THE INVENTION

To overcome the shortcomings of the prior art, it is an object of the present invention to provide a method of fabricating an integrated circuit wafer with a plurality of integrated circuits on the wafer, such that the propagation of cracks and crack damage induced by the wafer dicing process is controlled or managed.

To achieve this and other objects, and in view of its purposes, the present invention provides a method of fabricating an integrated circuit wafer having a plurality of integrated circuits on the wafer, said method to manage propagation of cracks in the integrated circuit wafer, comprising the step of forming a gate conductor between and encircling each of the plurality of integrated circuits wherein the gate conductor is separated from each of the plurality of integrated circuits.

It is a further object of the present invention to provide a method of fabricating an integrated circuit wafer having a plurality of integrated circuits on the wafer, where the integrated circuits are each separated by a channel, said channel having a gate conductor layer formed therein, said method to manage propagation of cracks in the integrated circuit wafer, comprising the step of forming the gate conductor layer between each of the plurality of integrated circuits wherein the gate conductor layer is separated from each of the plurality of integrated circuits by a minimum effective distance.

It is a further object of the present invention to provide a method of fabricating an integrated circuit wafer having a plurality of integrated circuits on the wafer, where the integrated circuits are each separated by a channel, said channel having a gate conductor layer formed therein, said method to manage propagation of cracks in the integrated circuit wafer, comprising the step of forming the gate conductor layer between each of the plurality of integrated circuits wherein the integrated circuit has a critical height and further wherein the gate conductor layer is separated from each of the plurality of integrated circuits by a minimum effective distance, and the minimum effective distance is greater than approximately 10% of the integrated circuit critical height.

It is still a further object of the present invention to provide a method of fabricating an integrated circuit wafer having a plurality of integrated circuits on the wafer, where the integrated circuits are each separated by a gate conductor, said method to manage propagation of cracks in the integrated circuit wafer, comprising the step of forming the gate conductor between and encircling each of the plurality of integrated circuits wherein the gate conductor has a divide that separates the gate conductor from each of the plurality of integrated circuits by a minimum effective distance.

A further aspect of the present invention, is an integrated circuit wafer resistant to crack propagation, comprising a wafer substrate; a plurality of integrated circuits formed on the wafer substrate; a plurality of crack stops formed in the integrated circuit wafer and encircling each of the plurality of integrated circuits, a gate conductor formed between each of the plurality of integrated circuits, each said gate conductor being separated from the respective integrated circuit by a minimum effective distance; and a dielectric layer formed on the wafer substrate and surrounding each of the plurality of crack stops.

It is to be understood that both the foregoing general description and the following detailed description are exemplary, and are not intended to be or should be considered restrictive of the invention.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of various features are arbitrarily expanded or reduced for clarity. Included in the drawings are the following figures.

DETAILED DESCRIPTION OF THE INVENTION

Figure 1A:
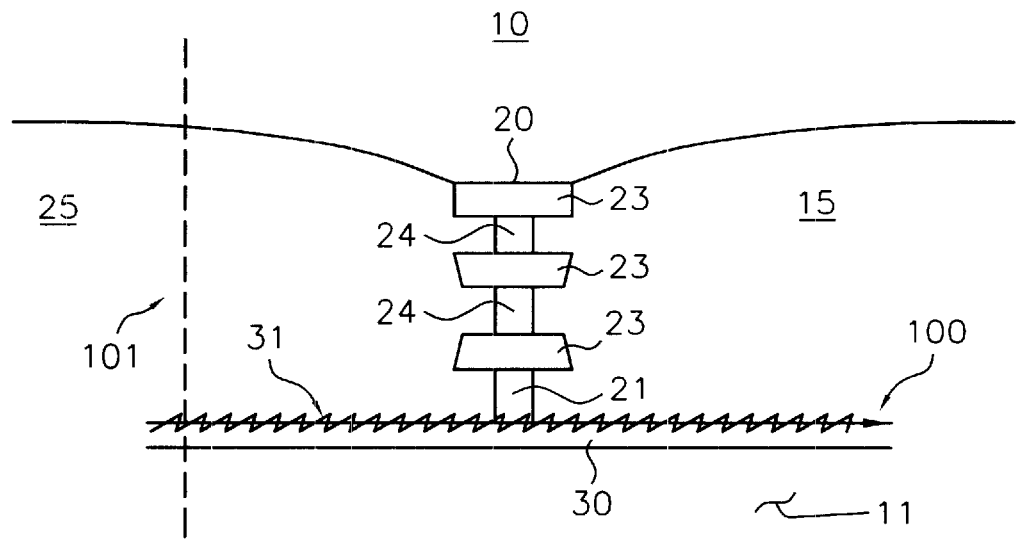
FIG. 1A shows a cut-away side view of a prior art wafer with a crack that has propagated along the gate conductor upper interface layer.

The invention will next be illustrated with reference to the figures in which the same numbers indicate the same elements in all figures. Such figures are intended to be illustrative, rather than limiting, and are included to facilitate the explanation of the process and structure of the present invention.

The present invention is a method for fabricating and manufacturing integrated circuits ("ICs") on wafers to manage or control crack damage in the ICs. The present invention also teaches ICs or chips that are manufactured according to the methods and having the inventive structure as disclosed herein.

More specifically, the method is for fabricating ICs to manage, reduce or eliminate crack propagation into the IC active array. In a preferred embodiment, the method provides for a defined separation or divide of the IC conductive layer or gate conductor from the IC metal wall crack stop. The method is especially useful in managing crack damage initiated in the IC gate conductor through the delamination of one or more of its thin surface films as a result of the IC wafer dicing process.

As used herein, the gate conductor should be understood to mean the conductive or semiconductive material connecting the source and drain of a silicon solid state transistor, or, more generally, any thin surface films deposited on the gate conductor which may be subject to horizontal separation or delamination. In typical IC's, the gate conductor is doped polycrystalline silicon ("polysilicon"). Typical surface films deposited on the gate conductor include, but are not limited to, metal silicides such as tungsten silicide, silicon dioxide and silicon nitride.

As illustrated in FIGS. 1A through 6, each showing a side cross sectional view of a section of an IC wafer 10, the fabrication of ICs on wafers generally has several layers formed or deposited on a substrate to build the IC, chip, active array 15 and the edge or boundaries of the IC. While the entire wafer may have many ICs formed on it, which are later separated for individual use, for illustrative purposes, FIGS. 1A through 6 only show one segment of the wafer 10.

The wafer segment shown in FIGS. 1A through 6, has part of the chip or active array 15, a crack stop 20, and a part of the kerf 25 or dicing channel 25. The segments of the kerf 25 and active array 15 shown in FIGS. 1A through 6 contain electrically insulative dielectric material or stacked layers of dielectric material, such as silicon nitride, silicon dioxide, or phosphosilicate glass ("PSG"). The metal wiring of the electrical elements in the active array 15, and of any electrical elements in the kerf, for example, process monitor structures, are further away from the illustrated crack stop area and are not shown in FIGS. 1A through 6.

FIG. 1A shows representative layers included in the fabrication of an IC wafer 10 including a typical crack stop 20 and its layers. In the dicing channel 25 are a gate conductor or conductive layer 30 and one or more thin films 31 deposited on the layer 30. The thin processed layers 31, may be tungsten silicide or similar alloy with a silicon nitride cap 35. The gate conductor 30 typically is a polysilicon material doped with an element such as boron or phosphorus to make it conductive.

As previously described, after forming the plurality of ICs on a wafer 10, the individual ICs are separated according to a dicing or cutting process that cuts the wafer within the kerf or dicing channel 25. The dicing process may involve a grind cut process or a scribe and break method. In the attached figures, a dashed line shows the approximate location of the wafer dicing cut 101. Under either of these methods or other dicing processes, the cutting of the wafer 10 often creates cracks or chips in the cut edge or delamination of one or more of the several layers deposited on the wafer. The thin films 31 on the gate conductor are particularly prone to delamination at the cut edge of the IC because of mechanical stresses induced by wafer dicing process.

FIG. 1A shows a typical prior art stacked metal wall crack stop 20 in which the first or lowest metal in the crack stop 20 is the contact 21 attached to the gate conductor 30. More particularly, as shown in FIG. 1A, the crack stop 20 may be made up of stacked layers of metal used for wiring or wiring levels 23, metal interlevel vias 24 used for connections between the wiring levels 23, and a first metal layer 21 used for contact with the gate conductor 30. Wiring levels 23 are typically made of aluminum. The interlevel vias 24 or studs interconnections are typically made of tungsten.

Figure 1B:
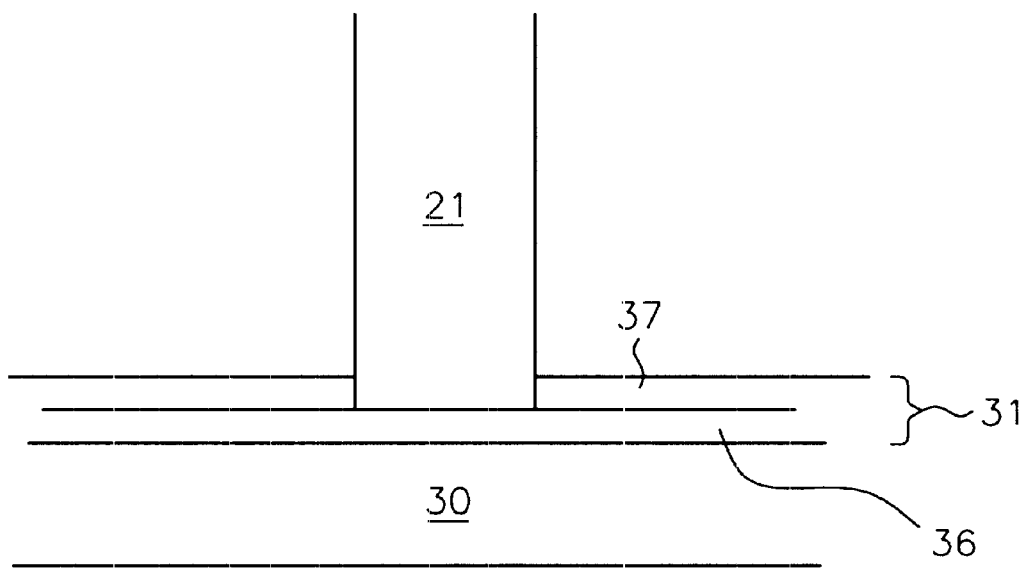
FIG. 1B shows an expanded cut-away side view of a prior art wafer with a crack stop formed on the gate conductor layer.

As shown in the expanded view of FIG. 1B, the thin films 31 on gate conductor 30 are typically comprised of an electrically conductive or semiconductive film 36 such as tungsten silicide, capped by an electrically insulative film 37 such as silicon nitride. The insulative film 37 must be removed prior to depositing the metal contact 21 on conductive film 36 to ensure intimate contact between metal contact 21 and film 36. The removal of insulative film 37 is typically by an etch process.

The metal wall crack stop 20 shown in FIG. 1A is effective in stopping edge cracks propagating in the dielectric material of the kerf 25 or propagating between layers of dielectric material. However, such a crack stop 20 is not effective in stopping cracks propagating due to delamination of the gate conductor layers. For example, if the conductive film 36 shown in FIG. 1B delaminated from gate conductor 30, the delamination would not be stopped by the metal wall crack stop 20. Similarly, if delamination of the insulative film 37 occurs and reaches the bottom of metal contact 21, such delamination could cause mechanical stress at the interface between metal contact 21 and conductive film 36 which could in turn separate metal contact 21 from conductive film 36. If such a separation occurs, the crack 100 could propagate into the active array 15 of the IC and cause failure.

Figure 2:
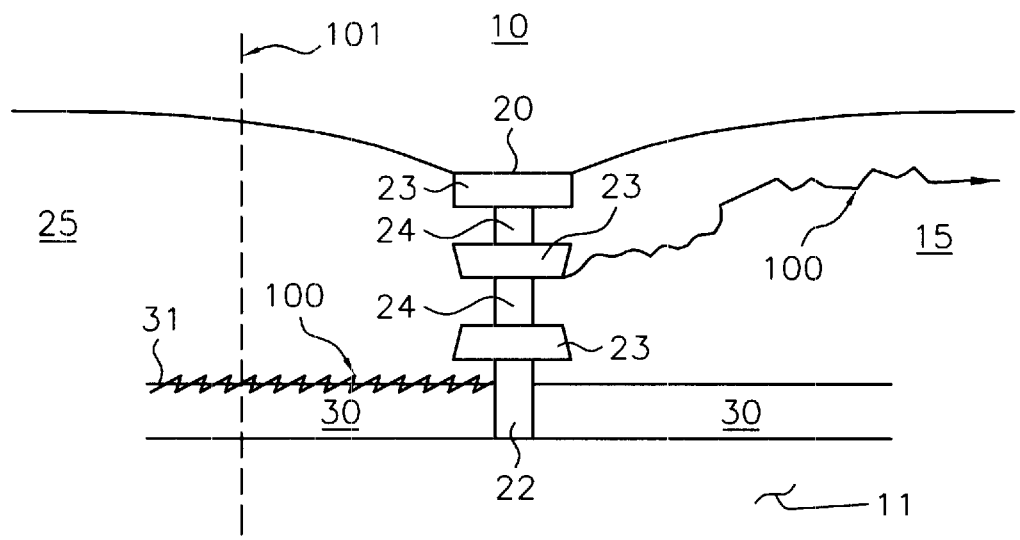
FIG. 2 shows a cut-away side view of a wafer with a crack that has formed from a delamination of a gate conductor interface layer and propagated into the active array through the crack stop.

FIG. 2 shows another metal wall crack stop 20 in which the first metal layer 22 is the contact with the substrate 11. If the metal wall crack stop structure 20 is sufficiently strong, or more particularly, if the adhesion between the several metal layers in the structure of the crack stop 20 are strong enough, the FIG. 2 crack stop 20 addresses the problems associated with the crack propagation shown in FIG. 1A and described above.

However, in certain applications, including SDRAM integrated circuits, it has been found that horizontal cracks or delaminations 100 formed in between the gate conductor surface films 31, may travel up the side of the crack stop 20 wall until a weak spot is encountered, and then pull apart the metal layers at that weak spot, as shown in FIG. 2. A weak spot is typically found at the interface of two dissimilar metals in the stacked metal crack stop 20, such as between tungsten and aluminum. Once through the crack stop 20, the crack 100 propagates further into the active array 15, as shown in FIG. 2, causing failures in the IC.

The propagation of crack 100 and failure of the IC is typically observed after processes that have high thermo-mechanical stress, such as the solder reflow process where a packaged IC is attached to a printed circuit board. Propagation of cracks 100 and IC failures have also been observed after cyclic temperature fluctuations caused by equipment on/off sequences. The IC failures are typically caused by separation or breakage of wiring metal in the IC active array 15 once the crack 100 has propagated far enough into the array.

Figure 3:
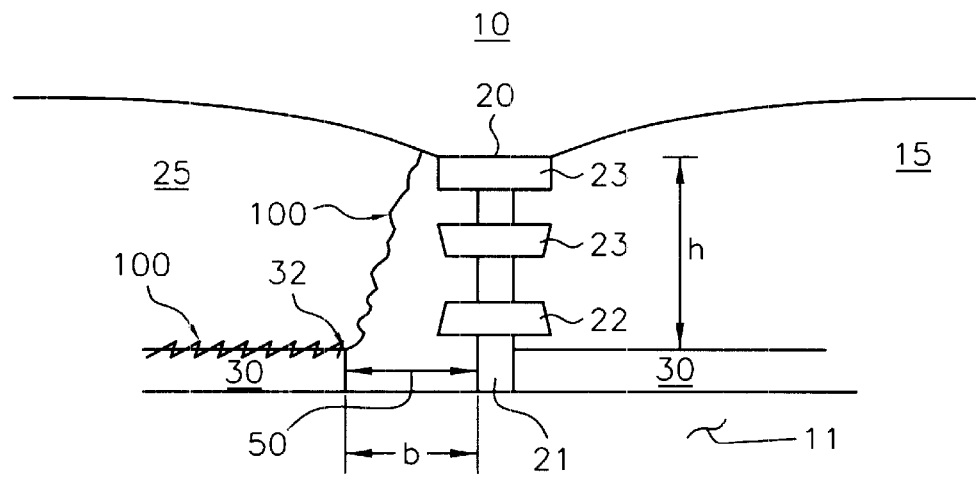
FIG. 3 shows a cut-away side view of an exemplary embodiment of a wafer formed according the present inventive method and exhibiting a crack formed from a delamination of a gate conductor interface layer and propagating within the wafer dielectric layer.

The present invention provides a method of manufacturing IC wafers 10 that addresses the mechanism of crack propagation along layer interfaces from the kerf 25 to the IC. As illustrated in FIG. 3, in a preferred embodiment, the gate conductor 30 formed in the dicing channel 25 is separated from the crack stop 20 or IC edge by a distance "b". Although the FIG. 3 illustration only shows one side or cross sectional view of the IC, for optimum results, the formation of a separation 50 of the gate conductor 30 from the crack stop 20 should be extended to include all sides of the IC or along the entire perimeter of the-IC to ensure that any delamination that occurs on any side of the IC is prevented from propagating into and damaging the chip active array 15. However, in other embodiments of the present invention or in certain applications of the present invention, separation 50 may not need to completely encircle the IC.

It has been found that in this embodiment, if a delamination occurs in the gate conductor 30 interface with an adjacent surface, the resulting crack 100 runs to the edge 32 of the gate conductor and either propagates vertically from the gate conductor edge 32 or propagates at a steep angle to the surface of the IC. Where the separation "b" or minimum effective distance 50 is appropriately selected, the propagation of the crack 100 from the gate conductor edge 32 terminates harmlessly at the wafer dicing channel top layer or at the surface of the IC. As shown in this example, the dicing channel section above the crack 100 may be completely loose and be removed in the dicing fluid or safely removed during the post-dicing wafer wash step.

A preferred embodiment of the present invention provides that the separation 50 of the gate conductor 30 should have minimum effective distance that is greater than approximately 10% of the height of the crack stop wall 20. Using the variables shown in FIG. 3:

$$b \geq 0.10(h)$$

where "h" is the height of the crack stop wall 20 and "b" is the distance between the edge 32 of the gate conductor and the edge of the crack stop wall 20.

It has been found that where the separation or minimum effective distance 50 is substantially less than ten percent of the crack stop wall height "h", a crack 100 that propagates from the gate conductor edge 32, may run to the crack stop 20 instead of terminating at the top of the dicing channel. As described above, with reference to FIG. 2, if the crack 100 runs to the crack stop 20 it may climb up the crack stop 20 and extend through the crack stop 20 by separating the crack stop layers at a weak interface between the layers. As noted above, once a crack 100 extends through the crack stop 20, it may propagate into the active array 15, again adversely affecting functional performance of the chip.

Figure 4:
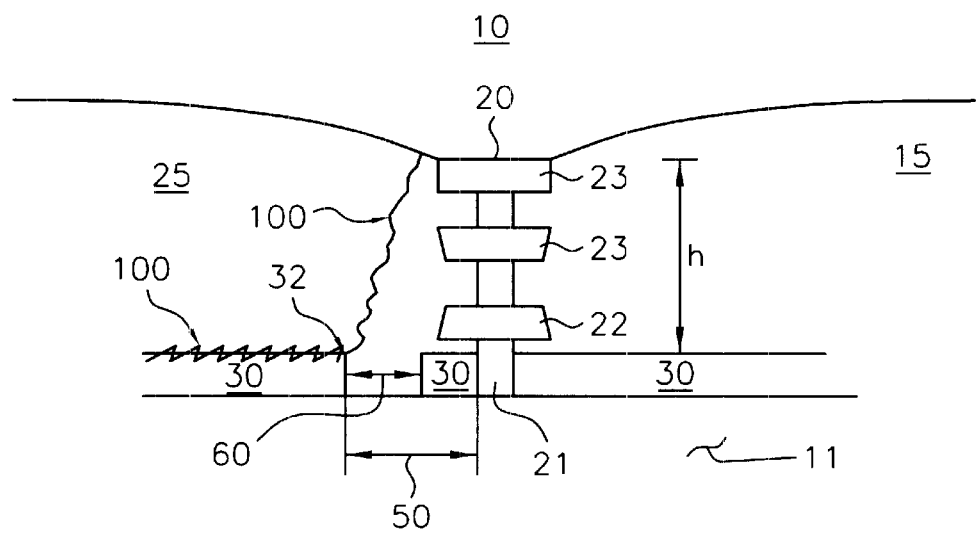
FIG. 4 shows a cut-away side view of an exemplary embodiment of a wafer formed according the present inventive method, exhibiting a crack formed from a delamination of a gate conductor interface layer and propagating within the wafer dielectric layer and having a continuation of the gate conductor adjacent to the kerf side of the crack stop.

Because there may be a need or desire to extend the gate conductor 30 to the crack stop 20 or IC edge, in another preferred embodiment of the present invention, the gate conductor 30 may be continued to the crack stop 20, but having a divide 60 formed in the conductive layer 30. As shown in FIG. 4, the gate conductor 30 still has an edge 32 formed a minimum effective distance 50 from the crack stop 20, but the gate conductor 30 is continued to the crack stop 20. It has been found that the critical dimensional guideline for placement and sizing of the separation 50, even where the gate conductor is continued to the crack stop 20, is still $b \geq 0.10$ (h). As in the above example, where the separation "b" or minimum effective distance 50 is appropriately selected, the propagation of the crack 100 from the gate conductor edge 32 terminates harmlessly at the wafer dicing channel top layer or at the surface of the IC.

Although the above described embodiments each make reference to a crack stop 20, in alternative preferred embodiments, the method of fabricating IC wafers 10 according to the present invention may use the edge or boundary of the active IC chip as the crack stop 20. In these configurations, the crack stops 20 may be any edge of the integrated circuit and accordingly may be the layers of conducting, semiconducting or insulating material forming the IC.

Figure 5:
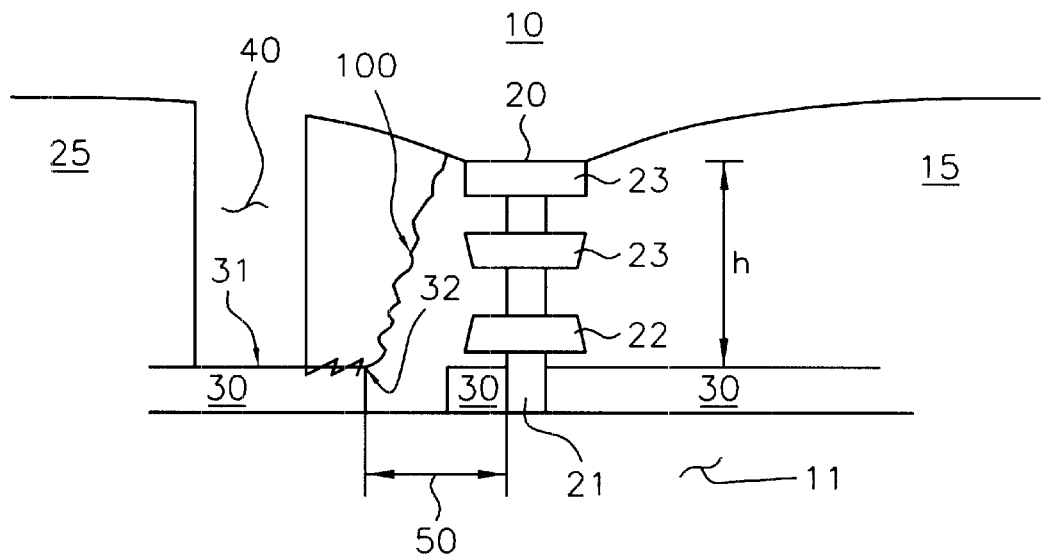
FIG. 5 shows a cut-away side view of an exemplary embodiment of a wafer formed according the present inventive method, exhibiting a crack formed from a delamination of a gate conductor interface layer and propagating within the wafer dielectric layer; having a continuation of the gate conductor adjacent to the kerf side of the crack stop; and having an air gap formed in the dielectric layer extending through to the gate conductor.
Figure 6:
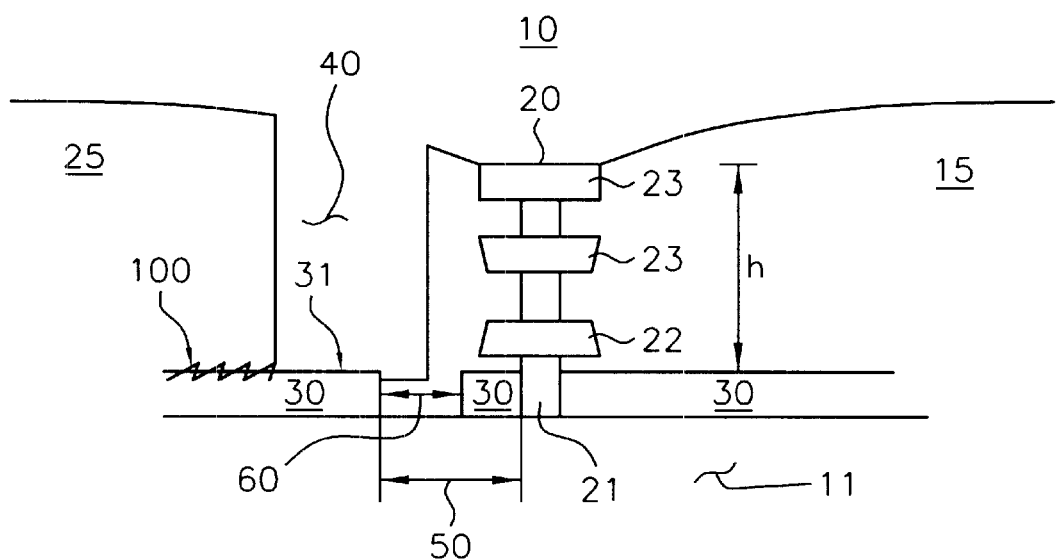
FIG. 6 shows a cut-away side view of an exemplary embodiment of a wafer formed according the present inventive method, exhibiting a crack formed from a delamination of a gate conductor interface layer and propagating within the wafer dielectric layer; having a continuation of the gate conductor adjacent to the kerf side of the crack stop; and having an air gap formed in the dielectric layer extending through to the gate conductor and extending beyond the step edge of the gate conductor.

In another preferred embodiment of the inventive method, as shown in FIGS. 5 and 6, an air gap 40 or channel may be formed in the IC dicing channel 25 as an additional crack stop or as the primary crack stop. As illustrated in FIG. 5, the air gap 40 is formed to extend only over the gate conductor 30. Where a crack 100 is induced in the gate conductor 30 interface, it will be drawn to the weak point in the structure, including the air gap 40. In many circumstances, the crack 100 may terminate at the air gap 40. However, even if crack 100 continues to propagate, due to continued delamination of the gate conductor 30 from the adjacent material, it will run to the gate conductor edge 32 and, as long as the edge 32 is dimensioned at least the minimum effective distance 50 from the IC edge or crack stop 20, then the crack 100 will harmlessly propagate up to the surface of the IC as shown in FIG. 5. This mechanism is essentially identical to that previously described with reference to FIGS. 3 and 4.

Another preferred embodiment and variation of the air gap structure illustrated in FIG. 6 shows the air gap 40 being formed to extend partially over the gate conductor 30 and partially over the divide 60. In this embodiment, crack 100 will be drawn to the air gap 40 as it propagates along the delaminated interface of the gate conductor 30 and will then terminate at the air gap. Because air gap 40 partially extends into the divide 60, crack 100 will not continue to propagate along the surface of the gate conductor 30 in view of the fact that at air gap 40 there is no delamination between layers that can occur or continue.

Although the invention has been described with reference to exemplary embodiments, it is not limited thereto. For example, if the polysilicon gate conductor is not prone to horizontal separation or delamination from its substrate, which may be the thin gate oxide layer or gate insulator, then only the surface films, and not the entire gate conductor, need to be designed and processed according to the present invention to gain the benefits of the invention. It is further intended to be understood that the following appended claims should be construed to include other variants and embodiments of the invention which may be made by those skilled in the art as being within the true spirit and scope of the present invention.

What is claimed is:

1. A method of fabricating an integrated circuit wafer having a plurality of integrated circuits on the wafer, said method to manage propagation of cracks in the integrated circuit, comprising the steps of:

a) building a plurality of crack stops to surround each of the plurality of integrated circuits, at least one of the plurality of crack stops extending through at least one of the plurality of integrated circuits to the gate conductor layer of the at least one integrated circuit; the gate conductor layer having at least one discontinuity between the at least one crack stop and a dicing line for the at least one integrated circuit, the discontinuity having two sides and a width at least equal to a minimum effective distance.

2. The method of fabricating an integrated circuit wafer as provided in claim 1, wherein the plurality of crack stops have a critical height, and further wherein the minimum effective distance is greater than approximately 10% of the crack stop critical height.

3. The method of fabricating an integrated circuit wafer as provided in claim 1, wherein the plurality of crack stops surrounding the integrated circuit are metal walls.

4. The method of fabricating an integrated circuit wafer as provided in claim 1, wherein the plurality of crack stops surrounding the integrated circuit are metal rings.

5. The method of fabricating an integrated circuit wafer as provided in claim 1, wherein the plurality of crack stops are metal walls made of stacked metal wire layers.

6. The method of fabricating an integrated circuit wafer as provided in claim 1, wherein the plurality of crack stops are each defined by an edge of each of the plurality of integrated circuits.

7. The method of fabricating an integrated circuit wafer as provided in claim 1 wherein one of the two sides of the discontinuity extends to the at least one crack stop.

8. The method of fabricating an integrated circuit wafer having a plurality of integrated circuits on the wafer, said method to manage propagation of cracks in the integrated circuit, comprising the steps of:

a) building a plurality of crack stops to surround each of the plurality of integrated circuits, each of the plurality of crack stops having two sides, at least one of the plurality of crack stops extending through at least one of the plurality of integrated circuits to the gate conductor layer of the at least one integrated circuit; the gate conductor layer having at least one discontinuity between the at least one crack stop and a dicing line for the at least one integrated circuit.

9. The method of fabricating an integrated circuit wafer as provided in claim 8 wherein the distance between the side of the discontinuity closest to the dicing line and the side of the crack stop closest to dicing line is at least equal to a minimum effective distance.

10. The method of fabricating an integrated circuit wafer as provided in claim 9 wherein the distance measure is based on the positions of the discontinuity and the crack stops at the gate conductor layer.

11. The method of fabricating an integrated circuit wafer as provided in claim 8, wherein the plurality of crack stops have a critical height, and further wherein the minimum effective distance is greater than approximately 10% of the crack stop critical height.

12. The method of fabricating an integrated circuit wafer as provided in claim 8, wherein the plurality of crack stops surrounding the integrated circuit are metal walls.

13. The method of fabricating an integrated circuit wafer as provided in claim 8, wherein the plurality of crack stops surrounding the integrated circuit are metal rings.

14. The method of fabricating an integrated circuit wafer as provided in claim 8, wherein the plurality of crack stops are metal walls made of stacked metal wire layers.

15. The method of fabricating an integrated circuit wafer as provided in claim 8, wherein the plurality of crack stops are each defined by an edge of each of the plurality of integrated circuits.

* * * * *